(12) United States Patent
Dewdney et al.

(10) Patent No.: US 9,423,478 B2
(45) Date of Patent: Aug. 23, 2016

(54) MAGNETIC SHIELD FOR MR MAGNET

(71) Applicants: Andrew Dewdney, Neunkirchen am Brand (DE); Matthias Drobnitzky, Spardof (DE); Bernhard Heinrich, Nürnberg (DE)

(72) Inventors: Andrew Dewdney, Neunkirchen am Brand (DE); Matthias Drobnitzky, Spardof (DE); Bernhard Heinrich, Nürnberg (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 545 days.

(21) Appl. No.: 14/013,332

(22) Filed: Aug. 29, 2013

(65) Prior Publication Data
US 2014/0062483 A1    Mar. 6, 2014

(30) Foreign Application Priority Data

Aug. 30, 2012    (DE) .......................... 10 2012 215 370

(51) Int. Cl.
*G01R 33/421*    (2006.01)
(52) U.S. Cl.
CPC .......... *G01R 33/4215* (2013.01); *G01R 33/421* (2013.01)
(58) Field of Classification Search
CPC .......................... G01R 33/421; G01R 33/4215
See application file for complete search history.

(56) References Cited

U.S. PATENT DOCUMENTS

| | | | | | |
|---|---|---|---|---|---|
| 4,409,579 A | * | 10/1983 | Clem | ................ | G01R 33/421 174/15.4 |
| 4,490,675 A | * | 12/1984 | Knuettel | ............ | A61B 5/0555 324/318 |
| 4,612,505 A | * | 9/1986 | Zijlstra | ............ | G01R 33/3873 324/300 |
| 4,646,046 A | * | 2/1987 | Vavrek | ................ | G12B 17/02 174/384 |
| 4,800,355 A | * | 1/1989 | Takechi | ............ | G01R 33/3875 335/299 |
| 5,012,217 A | * | 4/1991 | Palkovich | ............ | G01R 33/421 324/318 |
| 5,038,129 A | * | 8/1991 | Oue | ................ | G01R 33/421 324/318 |
| 5,128,643 A | * | 7/1992 | Newman | ............ | G01R 33/421 324/318 |
| 2006/0186884 A1 | | 8/2006 | Demarrais | | |

FOREIGN PATENT DOCUMENTS

DE    3301630 A1    7/1984

* cited by examiner

Primary Examiner — G. M. Hyder

(57) ABSTRACT

A magnetic shield for a field magnet of a magnetic resonance system is provided. A magnet apparatus with a field magnet for a magnetic resonance system with active shielding and a magnetic shield, wherein the magnetic shield forms a hollow body which accommodates the field magnets is also provided. A wall of the hollow body has a first, a second and a third area, which are disposed along the axis. In this case the second area separates the first area and the third area from one another and has a smaller wall thickness than the first and the third area.

8 Claims, 4 Drawing Sheets

MAGNETIC SHIELD FOR MR MAGNET

CROSS REFERENCE TO RELATED APPLICATIONS

The present application claims priority to German application No. 102012215370.5 DE filed Aug. 30, 2012, the entire content of which is hereby incorporated herein by reference.

FIELD OF INVENTION

The invention relates to a magnetic shield for a field magnet of a magnetic resonance system and to a magnet apparatus with a field magnet for a magnetic resonance system with active shielding and a magnetic shield, wherein the magnetic shield forms a hollow body which accommodates the field magnets.

BACKGROUND OF INVENTION

Magnetic resonance tomography as an imaging method is known from the prior art, in which the hydrogen density and binding conditions in an object under examination are determined on the basis of an excitation of the nuclear resonance of the protons in the nuclei of the hydrogen in an external magnetic field B0 by means of an external radio frequency signal and a radio frequency measurement signal emitted thereupon by the object under examination and converted into a pictorial representation of the object under examination. In such cases all water-retaining tissue can be recorded.

The quality of the radio-frequency measurement signal and the images generated therefrom increases in such cases with the strength of the applied static magnetic field B0, since, as the field B0 increases, the energy gap of the states of the proton in the magnetic field increases. This leads, in thermal equilibrium, to an occupancy difference and thus to the signal strength becoming greater. Typical field magnets for magnetic resonance tomography nowadays have magnetic fields of between 0.3 T and 1.5 T, devices with 3 T are also already available.

These are set against regulatory restrictions for magnetic fields in order to restrict the magnetic field strengths to which people are exposed over a long period. This relates in particular to the operating personnel who, by contrast with patients, spend day after day in the vicinity of the field magnets. A typical legal limit amounts to 0.5 mT, but can vary from country to country.

To comply with these limit values it has long been usual to use shields made of ferromagnetic material with a high magnetic permeability, such as soft iron for example. In such cases the limit value can be complied with on the one hand by large material thicknesses of the shield or by a greater distance to the field magnet. Especially with mobile use of magnetic resonance tomographs however, as is described in publication US 2006/0186884 A1, limits are imposed both by the permitted overall weight and also by the external dimensions.

As a weight-reduction and space-saving method for active shielding of a superconducting field magnet, it is known from publication DE 3301630 A1 that the field magnets can be surrounded with superconducting coils around their outer circumference, which generate an opposing magnetic field, and through this reduce the resulting magnetic field in an external space of the magnet apparatus, so that the ferromagnetic shield can be embodied thinner.

The magnetic shield by a ferromagnetic surrounding construction however interacts with the magnetic field B0. The stronger the magnetic field lines run in the external space of the field magnets in the ferromagnetic material, the better is the shielding effect however. At the same time however the coupling of the shielding to the magnetic field increases. This leads to changes in the magnetic shielding also changing the magnetic field B0, especially in the inner chamber of the field magnet, which is required to be highly constant in the spatial and temporal respect in order not to disturb the measurement signal and to achieve an optimum measurement result or an optimum image quality. Changes, which stem from a mechanical load or a change in temperature, can be caused for example by a spatial displacement or deformation of the ferromagnetic shield.

SUMMARY OF INVENTION

Consequently the object of the present invention is to provide a magnetic shield and also a magnet apparatus for a magnetic resonance system which reduces a disturbance of the static magnetic field B0.

The object is achieved by an inventive magnetic shield for a field magnet of a magnetic resonance system with active shielding and an inventive magnet apparatus for a magnetic resonance system with a field magnet with active shielding and an inventive magnetic shield. The term magnetic resonance system here includes both imaging magnetic resonance systems such as magnetic resonance tomographs and also magnetic resonance spectroscopes.

The inventive magnetic shield forms a hollow body which extends along an axis and which is designed to accommodate the field magnets. A wall of the hollow body has a first, a second and a third area, which are disposed along the axis.

In this case the second area separates the first area and the third area from one another and has a smaller wall thickness than the first and the third area.

The inventive magnetic shield has a series of advantages. The smaller wall thickness in the second area reduces the weight of the shield in this second area and also the total weight of the magnetic shield. In addition the thin wall thickness couples less to the magnetic field which conversely leads to a change in the position or shape in the second area having a smaller effect on the static magnetic field B0 inside the field magnets and thus causes less disturbance during imaging.

The inventive magnet apparatus for a magnetic resonance system has a field magnet with active shielding and a magnetic shield as claimed in one of the preceding claims. A magnetic field of the actively-shielded field magnet without magnetic shield has a fourth area in an outer area in the vicinity of the field magnet in which the amount of the magnetic field has a local minimum as a function of the location along the axis. The inventive magnetic shield is disposed such that the fourth area and the second area of the magnetic shield lie in a common plane at right angles to the axis.

The inventive magnet apparatus for a magnetic resonance system also has a series of advantages. Since the magnetic field of the actively shielded field magnet has a local minimum in the amount of field strength of the magnetic field along the axis and the second area of the magnetic shield is disposed in a plane relative to the axis with the local minimum, the magnetic field in the second area with the thinner wall thickness is lower, so that even with the thinner wall thickness, an adequate shield of the magnetic field is possible. This is because the effect of the magnetic shield displaces the field lines towards the shield, so that the minima are also disposed in the magnetic shield and the magnetic field is reduced by comparison with a field magnet without minima.

Advantageous developments of the invention are disclosed in the dependent claims.

In one embodiment an inner surface of the second area facing towards the inner space of the hollow body is recessed in relation to the inner surfaces of the first and the third device facing towards the inner space of the hollow body.

This recess advantageously enlarges a distance between the second area and a field magnet which is able to be disposed in the inner space of the hollow body formed by the shield. Therefore the field strength of the field magnet which reduces with the distance is advantageously smaller in the second area, which is why the shield can be designed thinner in order to achieve the same shielding effect.

In an embodiment the magnetic shield is designed as a prism, for example as a pipe or as a hollow square. Prismatic shapes have the advantage of being able to be formed easily and at low cost from flat surfaces by folding, bending or connection.

In an embodiment it is also conceivable for a wall of the magnetic shield to have a material in the second area with higher magnetic permeability than walls of the first or of the third area. The advantage of a material with higher magnetic permeability is that even with smaller thickness it already has a comparable shielding effect and can thus be designed thinner and lighter than a shield with a comparable effect made from a material with lower magnetic permeability.

It is also possible that in one embodiment the wall of the magnetic shield in the second area in a first direction at right angles to the axis has a smaller wall thickness than in a second direction at right angles to the axis, wherein the first and the second direction are not parallel to one another and enclose an angle. It is thus possible in an advantageous manner to design the shield effect of the magnetic shield differently in different spatial directions. In a magnetic resonance system there are areas in which people or devices cannot be located, for example the area above a trailer which is in the open air. Therefore the shield can be reduced in these directions and thus weight reductions and cost savings made without exceeding limit values or causing disruptions in imaging by devices positioned there.

In one embodiment of the inventive magnet apparatus is also conceivable for the field magnet to have an inner space for accommodating an object under examination, wherein the magnetic field in the inner space is aligned homogeneously and parallel to the axis and wherein the fourth area lies jointly with the inner space in a plane at right angles to the axis. The inner space with the homogeneous and parallel aligned field B0 required for imaging allows optimum imaging without disruptive artifacts in this volume. By this inner space being disposed abeam and at the smallest distance from the fourth area with the field minimum in the external space of the field magnet and the second area of the shield, the magnetic shield around this inner space is embodied thinner. This also leads in an advantageous manner to there being lower feedback from the shield to the magnetic field B0 in the inner space and thus to variations in the shield as regards position, form, temperature or other factors having the smallest possible negative effect on the result of the magnetic resonance examination.

In one embodiment it is conceivable in such cases for the second area of the magnetic shield to be disposed between the fourth area and the field magnet. This is because the effect of the magnetic shield displaces the field lines towards the shield, so that the minima are also disposed in the magnetic shield and the magnetic field is reduced by comparison with a field magnet without minima. Simultaneously the dimensions of the magnetic shield are reduced.

In another embodiment however it is also conceivable for the fourth area to be disposed in the second area of the magnetic shield. In this way the dependence of the magnetic field B0 on variations of the shield is at its lowest.

BRIEF DESCRIPTION OF THE DRAWINGS

The properties, features and advantages of the present invention as described above and the manner in which they are achieved will become clearer and more readily comprehensible in conjunction with the description which follows of the exemplary embodiments set out in more detail in conjunction with the drawings, In the figures.

DETAILED DESCRIPTION OF INVENTION

Figure 1:
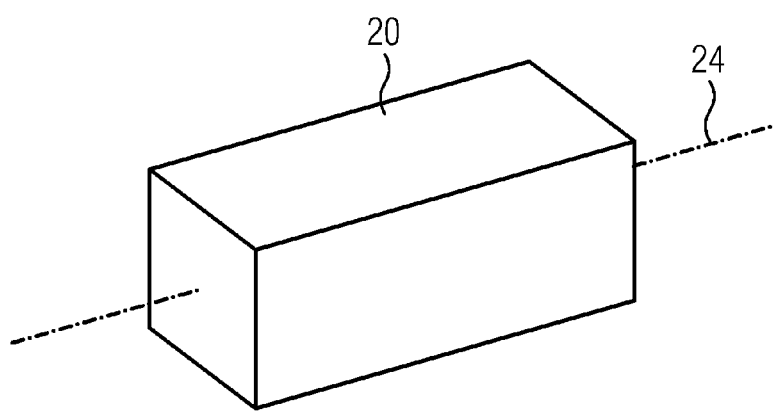
FIG. 1 shows a perspective view of an inventive magnetic shield.
Figure 2:
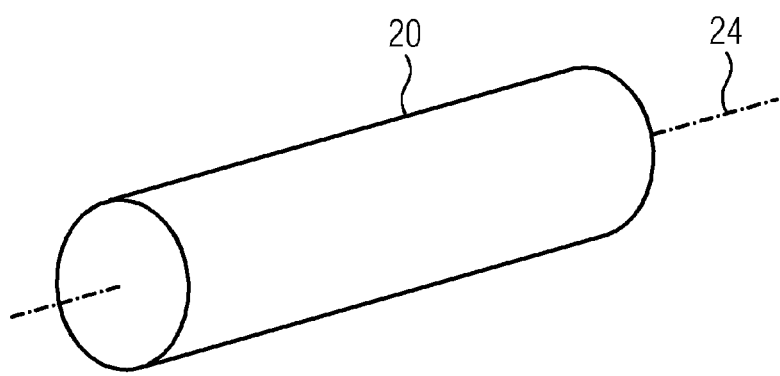
FIG. 2 shows a perspective view of another embodiment of an inventive magnetic shield.

FIG. 1 and FIG. 2 show perspective views of two possible embodiments of an inventive magnetic shield. The shield has the form of a hollow body, which extends along the axis 24. Usually the walls 25 of the hollow body are parallel to one another, so that the hollow body assumes the form of a prism. As a base surface any given polygons, such as a square or hexagon for example, are possible. Round base surfaces are also conceivable, so that the magnetic shield assumes a cylindrical shape for example.

The hollow body of the magnetic shield 20 is preferably open at both ends along the axis 24, which makes it possible for example to introduce a patient from one side into a magnetic resonance tomograph 1 with an inventive magnetic shield 20 into an inner chamber 13 in which the imaging takes place. By the patient being moved along the axis 24 through the inner chamber 13, the entire length of the patient's body can be imaged, wherein the patient leaves the magnetic resonance tomograph 1 again on an opposite side lying along the axis 24. But it is also conceivable for magnetic resonance tomographs 1 which are only designed for examining one part of the body which can be accommodated entirely by the inner chamber 13, to be closed off on one side along the axis 24.

Figure 3:
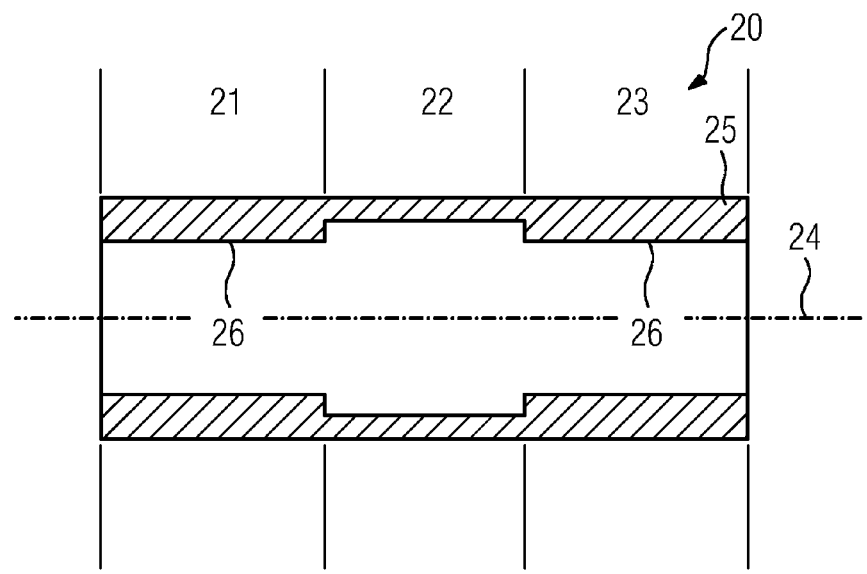
FIG. 3 shows a horizontal cross section of an inventive magnetic shield.

FIG. 3 shows a cross section through an embodiment of an inventive magnetic shield. In this figure the diagram shows a horizontal cross section along the axis 24 or line A-A in FIG. 1 and FIG. 2. It can be seen from FIG. 3 that the inventive magnetic shield 20 is divided along the axis 24 into three areas 21, 22, 23. The areas 21, 23 are disposed in each case at the opposite ends of the hollow body along the axis 24. The area 22 is located between the areas 21, 23 which extends in the circumferential direction in relation to the axis 24 around the entire hollow body, so that the areas 21, 23 are separated from one another and have no direct points of contact. In this case, as can also be seen in FIG. 3, the wall 25 of the hollow body is designed in the area 22 with a smaller wall thickness.

In a preferred embodiment of the magnetic shield 20 in this case the inner surface 26 of the hollow body which faces towards the axis 24 is set back in the area 22 in relation to the inner surface 26 in the areas 21, 23, so that the inner surface 26 of the area 22 is at a greater distance from the axis 24 than the inner surface 26 in the areas 21, 23.

In the embodiment shown in FIG. 3 a step is formed in this case on the inner surface 26 at the transition between the area 22 and the areas 21, 23. In another embodiment however it is also conceivable for the transition to occur in a continuous form, for example in a curve or a conical shape. It is likewise possible for the hollow body not to have any rotational symmetry as in FIG. 2, so that at a few locations along the circumference the distance between the inner surface 26 and the axis 24 in area 22 can also be smaller than in the areas 21, 23 at other locations in the circumferential direction. What these embodiments have in common however is that at adjacent points on the inner surface 26 in the area 22 and the areas 21, 23 in a direction parallel to the axis 24, the point in area 22 is at the greater distance from the axis 24 in each case.

Figure 4:
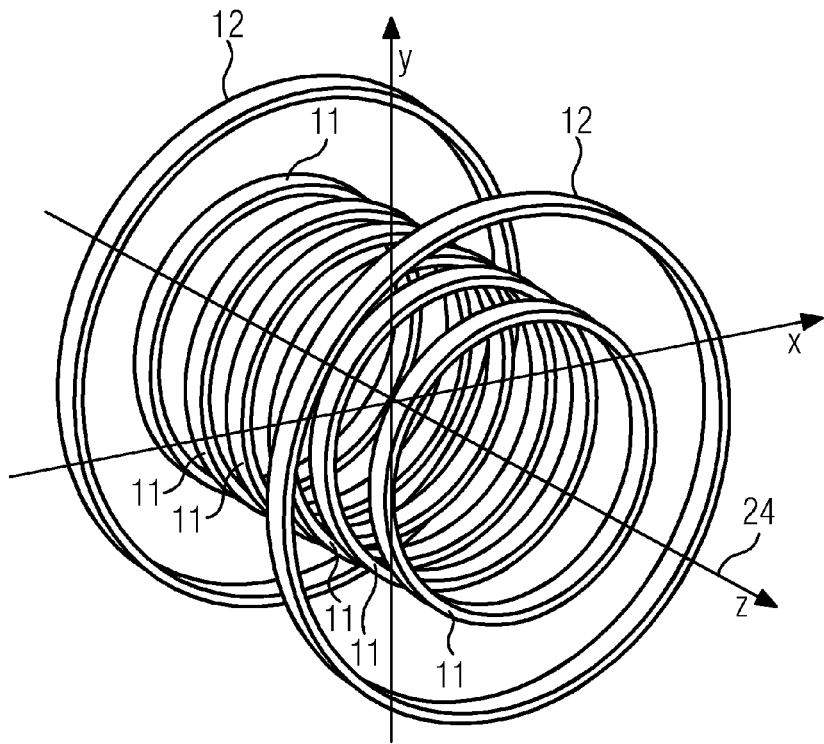
FIG. 4 shows a schematic view of the coils of a field magnet with active shielding.

FIG. 4 shows a schematic view of the coils 11, 12 of a typical magnet apparatus 10. The magnet apparatus 10 has a field magnet 11 which is composed of a plurality of coils 11 for generating a static magnetic field. In order to reduce the magnetic stray field outside the field magnet 11, active shielding 12 in the form of coils 12 is disposed on the outside. In a preferred embodiment these coils 12 are arranged in the direction of the axis 24 adjacent to the ends of the field magnet 11. In such cases the current direction in the coils of the active shield 12 is opposite to the current direction in the coils of the field magnet 11, so that in the outer area of the magnet apparatus 10 the magnetic fields of the coils 11 and coils 12 are opposing and the resulting field strength of the magnetic field in the outer area is reduced.

In a preferred embodiment the coils 11 and 12 are made of superconducting materials and current is flowing through them. The necessary power leads, power supply, thermal insulation, coolants and also constructive means for spatial arrangement of the coils 11, 12 are not shown in FIG. 4 for reasons of clarity.

Figure 5:
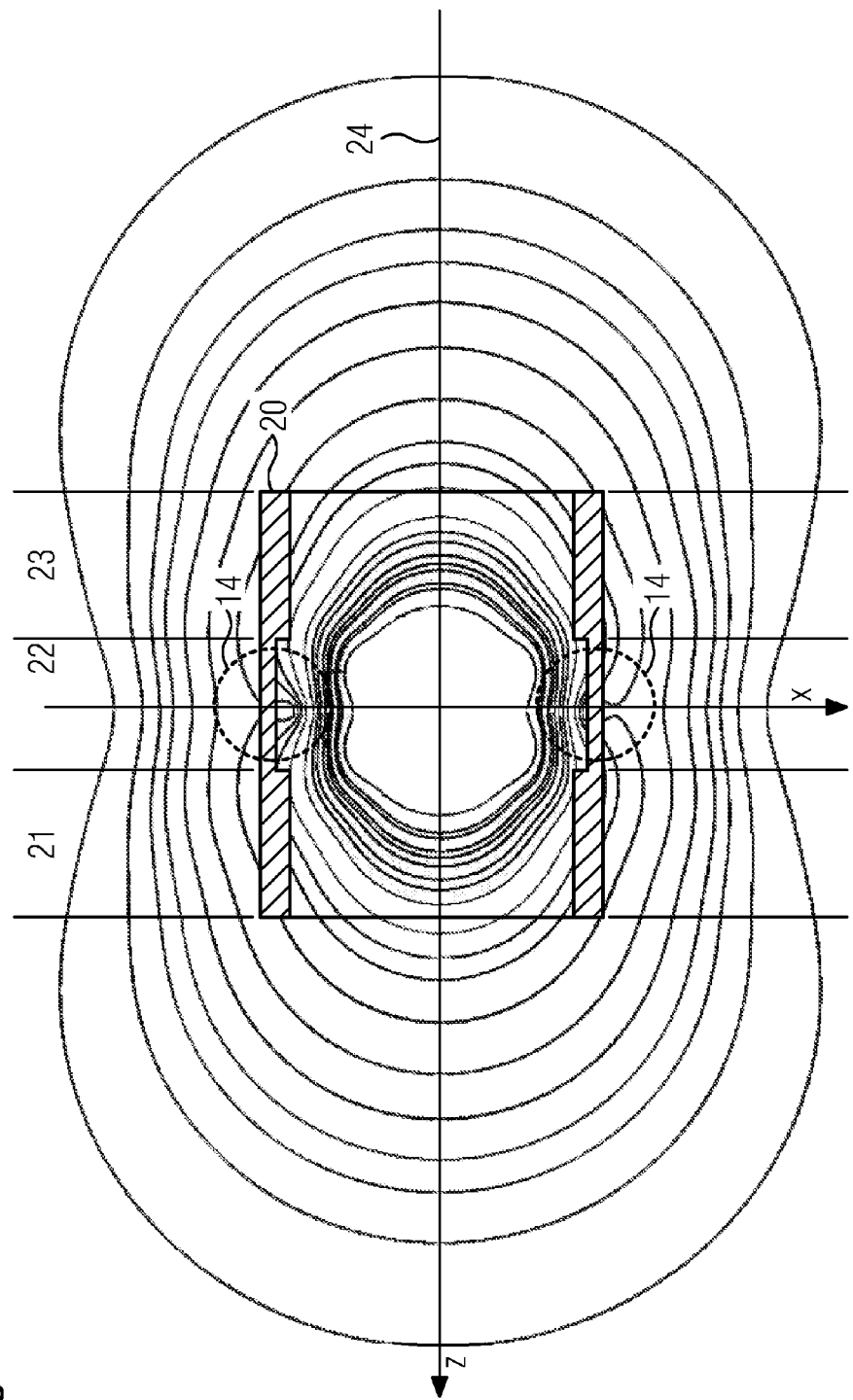
FIG. 5 shows a diagram of the magnetic field strength of a field magnet and the arrangement of an inventive magnetic shield and FIG. 6 shows a schematic diagram in cross section of a magnetic resonance tomograph with an inventive magnetic shield.

FIG. 5 shows a typical distribution of the magnetic field strength of a field magnet with active shielding from FIG. 4. The field extends along the axis 24 especially far into the chamber since the magnetic poles of the field magnet are oriented in this direction. In a direction at right angles to the axis 24 away from the field magnets 10 disposed in the central point the field strength falls away significantly more quickly. One of the reasons for this is the natural field distribution of a coil through which current is flowing. On the other hand this effect is increased further by the opposing magnetic field of the active shielding 12, so that the lines of equal field strength are concentrated in this direction.

The arrangement of the two coils 12 of the active shielding at the respective opposing ends of the field magnet 11 in the direction of the axis 24 produces in a plane at right angles to the axis 24 and symmetrical to the coils 12 at a certain distance from the axis 24 a marked constriction of the lines of the same field strength, which is identified in FIG. 5 with the fourth area 14. This area extends in the circumferential direction symmetrically around the axis 24. If the amount of the magnetic field strength along a line in parallel to the axis 24 through the fourth area 14 is considered, then this amount decreases precisely in the area 14 and exhibits a local minimum in the plane through the axis of symmetry of the field magnet.

Figure 6:
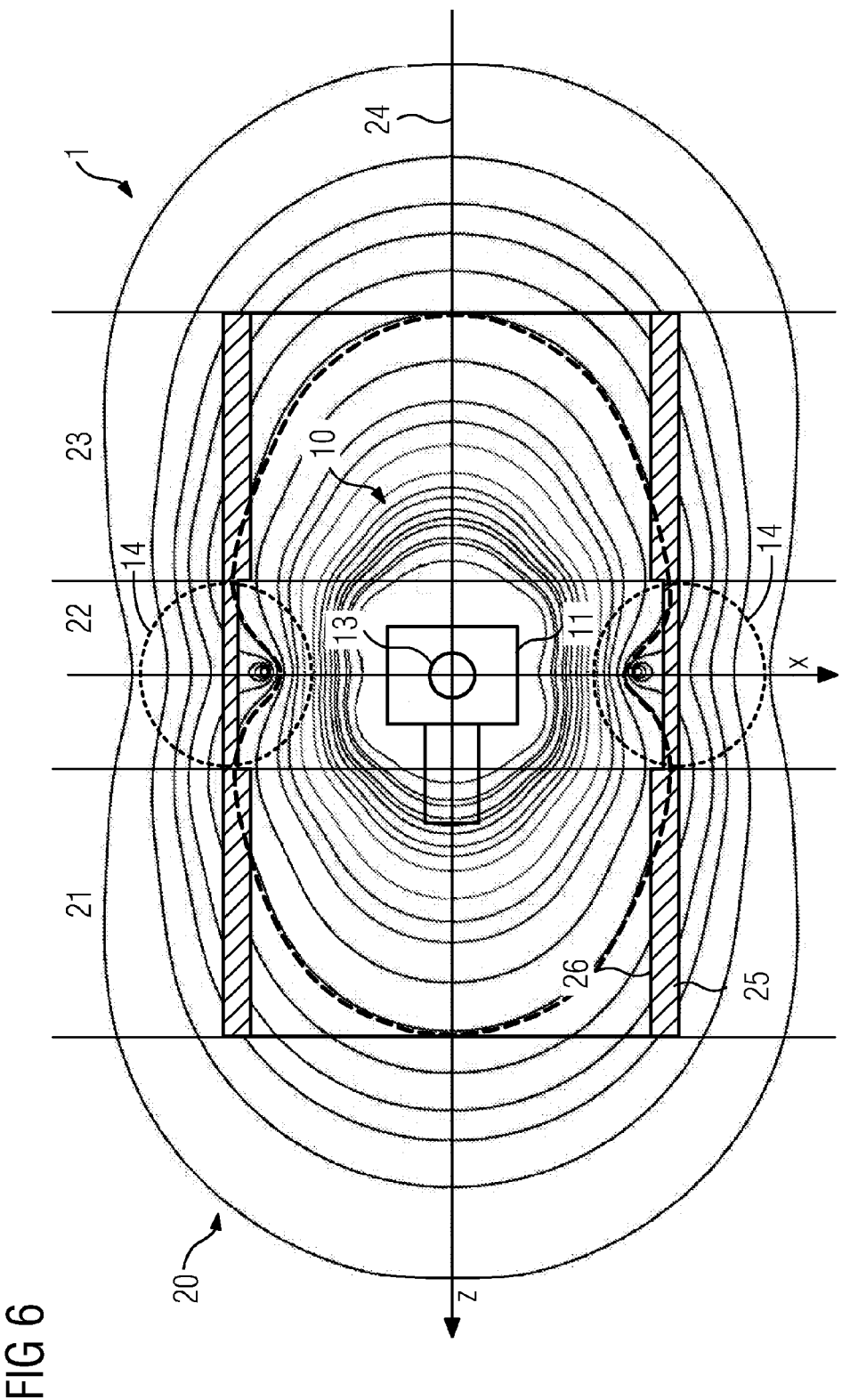

Because of this minimum of the field strength it is possible, in the fourth area 14, to achieve a desired magnetic shield effect with a smaller wall thickness of the shield. Inventively the magnetic shield 20 is thus positioned such that the second area 22 of the magnetic shield comes to rest precisely in the fourth area 14 of the magnetic field in which the magnetic field strength assumes a minimum, as is shown schematically in FIGS. 5 and 6. In FIG. 6 the relative position of the field magnet 11 of the magnetic resonance tomograph 1 and of the inner chamber 13 is also reproduced for clarification, in which imaging can be undertaken because of the homogeneity of the magnetic field B0. In such cases, because of the local minimum, even changes in the magnetic shield 20, for example in relation to the position, have a minimal effect, since in the first approximation such effects are proportional to the first derivation, which in its turn is a function close to the value zero in the vicinity of a local minimum.

This positive effect is also produced when the second area 22 of the magnetic shield, not as shown in FIG. 5 and FIG. 6, intersects with the fourth area 14, but instead also when the second area 22 is disposed between the fourth area 14 and the field magnet 11. The field distribution shown in FIGS. 5 and 6 shows the field of the field magnet 11 with active shielding 12. The magnetic field varies through the permeability of the magnetic shield 20. In particular the magnetic field lines are displaced towards the magnetic shield 20 and concentrate inside said shield. The fourth area 14 with the minimum of the field strength will therefore shift under the influence of the magnetic shield 20 towards the second area 22, so that the advantageous effect also occurs if the magnetic shield 20 is located between the minimum of the magnetic field strength of the magnetic field without magnetic shield 20 and the field magnet 11.

The diagrams in FIGS. 5 and 6 are not true-to-scale, especially not as regards the wall thicknesses, but are only intended to show the relationships. Thus such a minimum of the amount is also produced if there is no symmetry in relation to the axis 24 or a plane at right angles thereto, only the position of the local minimum varies accordingly in this case. The area 22 of the magnetic shield must be positioned accordingly in accordance with the invention in this minimum or between the minimum and the field magnet 11.

The inventive magnetic shield and the inventive magnet apparatus can also be used for magnetic resonance systems other than the magnetic resonance tomographs shown, such as magnetic resonance spectroscopes for example.

Although the invention has been illustrated and described in detail on the basis of the preferred exemplary embodiment, the invention is not limited by the disclosed examples and other variations can be derived herefrom by the person skilled in the art, without departing from the scope of protection of the invention.

We claim:

1. A magnetic shield for a field magnet of a magnetic resonance system with active shielding, comprising:
    a hollow body which extends along an axis and is designed to accommodate the field magnet; and
    a wall including a first area, a second area, and a third area which are disposed along the axis,
    wherein the second area separates the first area and the third area from one another, and
    wherein the second area has a smaller wall thickness than the first area and the third area and an inner surface of the second area facing towards the inside of the hollow body is recessed in relation to the inner surfaces of the first area and of the third area facing towards the inside of the hollow body.

2. The magnetic shield as claimed in claim 1, wherein the hollow body is a prism.

3. The magnetic shield as claimed in claim 1, wherein the wall in the second area has a material with higher magnetic permeability than the wall of the first area or the wall of the third area.

4. The magnetic shield as claimed in claim 1,
wherein the wall in the second area has a smaller wall thickness in a first direction at right angles to the axis than in a second direction at right angles to the axis, and
wherein the first and the second direction are not parallel to one another and enclose an angle.

5. A magnet apparatus for a magnetic resonance system, comprising:
a field magnet with active shielding and a magnetic shield,
wherein the magnetic shield forms a hollow body which extends along an axis and is designed to accommodate the field magnet,
wherein a wall of the hollow body has a first area, a second area and a third area which are disposed along the axis,
wherein the second area separates the first area and the third area from one another and
wherein the second area has a smaller wall thickness than the first area and the third area,
wherein a magnetic field of the actively shielded field magnet without the magnetic shield has a fourth area in the vicinity of the field magnet, in which the amount of the magnetic field has a local minimum as a function of the location along the axis,
wherein the magnetic shield is disposed so that the fourth area and the second area of the magnetic shield lie in a common plane at right angles to the axis, and
wherein the field magnet with the active shielding is disposed within the magnetic shield.

6. The magnet apparatus as claimed in claim 5,
wherein the field magnet has an inner chamber for accommodating an object under examination,
wherein the magnetic field is aligned in the inner chamber homogeneously and in parallel to the axis, and
wherein the fourth area lies jointly with the inner chamber in a plane at right angles to the axis.

7. The magnet apparatus as claimed in claim 5, wherein the second area of the magnetic shield is disposed between the fourth area and the field magnet.

8. The magnet apparatus as claimed in claim 5, wherein the fourth area is disposed in the second area of the magnetic shield.

* * * * *